(12) United States Patent
Choi et al.

(10) Patent No.: US 9,343,532 B2
(45) Date of Patent: May 17, 2016

(54) SEMICONDUCTOR DEVICE CONTAINING GRAPHENE P-N JUNCTIONS AND METHOD FOR PRODUCING SAME

(71) Applicant: UNIVERSITY—INDUSTRY COOPERATION GROUP OF KYUNG HEE UNIVERSITY, Yongin-si, Gyeonggi-do (KR)

(72) Inventors: Suk Ho Choi, Suwon-si (KR); Sung Kim, Seoul (KR); Dong Hee Shin, Cheonan-si (KR)

(73) Assignee: UNIVERSITY-INDUSTRY COOPERATION GROUP OF KYUNG HEE UNIVERSITY, Yongin-si (KR)

(*) Notice: Subject to any disclaimer, the term of this patent is extended or adjusted under 35 U.S.C. 154(b) by 0 days.

(21) Appl. No.: 14/419,138

(22) PCT Filed: Dec. 28, 2012

(86) PCT No.: PCT/KR2012/011708
§ 371 (c)(1),
(2) Date: Feb. 2, 2015

(87) PCT Pub. No.: WO2014/021522
PCT Pub. Date: Feb. 6, 2014

(65) Prior Publication Data
US 2015/0206940 A1    Jul. 23, 2015

(30) Foreign Application Priority Data
Aug. 2, 2012  (KR) .................. 10-2012-0084861

(51) Int. Cl.
*H01L 29/16*   (2006.01)
*H01L 29/88*   (2006.01)
(Continued)

(52) U.S. Cl.
CPC .......... *H01L 29/1606* (2013.01); *H01L 21/041* (2013.01); *H01L 21/043* (2013.01);
(Continued)

(58) Field of Classification Search
CPC ............... H01L 29/1606; H01L 33/00–33/648
See application file for complete search history.

(56) References Cited

U.S. PATENT DOCUMENTS 5,930,133 A * 7/1999 Morizuka ............... H01L 29/88
257/E29.339
8,866,265 B2 * 10/2014 Bao ........................ H01L 51/424
257/613

(Continued)

FOREIGN PATENT DOCUMENTS

| KR | 10-2012-0029332 A | 3/2012 |
| KR | 10-2012-0029339 A | 3/2012 |
| KR | 10-2012-0099910 A | 9/2012 |

OTHER PUBLICATIONS

Korean Office Action for KR 10-2012-0084861 dated Jul. 30, 2013.
(Continued)

*Primary Examiner* — Victor A Mandala
*Assistant Examiner* — Regan J Rundio
(74) *Attorney, Agent, or Firm* — Sughrue Mion, PLLC

(57) ABSTRACT

The aim of the present invention is to provide a semiconductor device containing a graphene p-n vertical tunneling-junction diode by assessing the optical and electrical characteristics of a graphene p-n junction produced by varying the doping concentration. The semiconductor device includes first graphene of a first doping type, and second graphene of a second doping type different from the first doping type, which is arranged on the first graphene and is in contact therewith.

12 Claims, 9 Drawing Sheets

(51) Int. Cl.
  *H01L 21/328* (2006.01)
  *H01L 29/861* (2006.01)
  *H01L 21/04* (2006.01)
  *H01L 21/324* (2006.01)
  *H01L 29/66* (2006.01)
  *H01L 21/02* (2006.01)

(52) U.S. Cl.
  CPC .......... *H01L21/324* (2013.01); *H01L 29/6603* (2013.01); *H01L 29/66136* (2013.01); *H01L 29/861* (2013.01); H01L 21/02444 (2013.01); H01L 21/02527 (2013.01)

(56) References Cited

U.S. PATENT DOCUMENTS

| | | | | |
|---|---|---|---|---|
| 8,890,277 | B2 * | 11/2014 | Hebard | H01L 29/1606 257/29 |
| 8,981,357 | B2 * | 3/2015 | Yoon | H01L 29/1606 257/40 |
| 9,054,708 | B2 * | 6/2015 | Kim | H03K 17/96 |
| 9,064,964 | B2 * | 6/2015 | Moon | H01L 29/78684 |
| 2011/0127638 | A1 | 6/2011 | Brenner et al. | |
| 2011/0186805 | A1 | 8/2011 | Bowers et al. | |
| 2011/0278545 | A1 | 11/2011 | Voutilainen et al. | |
| 2012/0049239 | A1 * | 3/2012 | Sung | H01B 1/04 257/103 |
| 2012/0068152 | A1 * | 3/2012 | Hwang | H01L 29/78684 257/9 |
| 2012/0068154 | A1 * | 3/2012 | Hwang | H01L 51/502 257/13 |
| 2012/0187377 | A1 | 7/2012 | Eaton et al. | |
| 2012/0247545 | A1 * | 10/2012 | Aria | B82Y 30/00 136/255 |
| 2014/0054550 | A1 | 2/2014 | Hong et al. | |
| 2014/0319385 | A1 * | 10/2014 | Mikhailov | H01L 29/4238 250/493.1 |
| 2015/0014630 | A1 * | 1/2015 | Choi | H01L 29/1606 257/24 |
| 2015/0166348 | A1 * | 6/2015 | Ikenuma | C01B 31/0438 429/231.95 |

OTHER PUBLICATIONS

International Search Report for PCT/KR2012/011708 dated May 14, 2013.

* cited by examiner

US 9,343,532 B2

SEMICONDUCTOR DEVICE CONTAINING GRAPHENE P-N JUNCTIONS AND METHOD FOR PRODUCING SAME

CROSS REFERENCE TO RELATED APPLICATIONS

This application is a National Stage of International Application No. PCT/KR2012/011708, filed Dec. 28, 2012, claiming priority from Korean Patent Application No. 10-2012-0084861, filed Aug. 2, 2012, the contents of all of which are incorporated herein by reference in their entirety.

TECHNICAL FIELD

The present invention relates to a semiconductor device and a method of fabricating the semiconductor device, and more particularly, to a semiconductor device provided through a vertical tunneling-junction of p-type graphene and n-type graphene and a method of fabricating the semiconductor device.

RELATED ART

Since the discovery of graphene, a two-dimensional single-layer material composed of carbon atoms, in 2004, graphene has been in the spotlight due to its new and excellent physical properties. In particular, since 2010 when the Nobel Prize in physics was awarded to Geim and Novoselov who had initially isolated monoatomic layer graphene, graphene has been drawing the global attentions and interests from researchers and ordinary persons.

As well known so far, graphene is the thinnest, the strongest, and the most-flexible material through which electricity or heat flows most excellently. Due to such excellent characteristics of graphene, it has been expected to be highly useful for a nanostructural material or for one of the most promising material candidates for post-silicon electronics. The use of graphene as a new material has been expanded to a next-generation display field such as a flexible display and a touch panel, an energy industry field such as a solar cell, and various electronic industry fields such as a smart window and a radio frequency identification (RFID).

Also, researchers have shown that a graphene sheet has a relatively-high electron mobility even at room temperature by measuring the electrical-conduction characteristics of single- or multi-layer graphene sheets, very promising for the use of graphene as a material for electronic materials. Graphene also has very excellent dynamic, electrical, and optical characteristics as a zero-gap semiconductor or semimetal. Graphene is transparent under a visible light and has a sufficient electrical conductivity and thus, may be employed for various optoelectronic devices, for example, solar cell, light emitting diode (LED), and touch screen.

To apply graphene in such various fields, studies on doping of graphene and electronic devices using the doped graphene are actively conducted.

DESCRIPTION OF INVENTION

Subjects

The present invention provides a semiconductor device containing graphene p-n vertical tunneling-junction diodes by assessing structural, optical, and electrical characteristics of graphene p-n junctions fabricated for various doping concentrations.

The present invention also provides a method of fabricating the semiconductor device.

Subjects to be achieved by the present invention are not limited to the aforementioned subjects and other subjects not described herein may be clearly understood by those of ordinary skill in the art from the following description.

Solutions

According to an aspect of the present invention, there is provided a semiconductor device including first graphene of a first doping type; and second graphene of a second doping type different from the first doping type, disposed on the first graphene and in contact with the first graphene.

According to another aspect of the present invention, there is provided a semiconductor device including a p-n diode, wherein a current flowing in response to applying a forward voltage to the p-n diode is a first current, a current flowing in response to applying a reverse voltage to the p-n diode is a second current, and the second current is greater than the first current.

According to still another aspect of the present invention, there is provided a method of fabricating a semiconductor device, the method including forming first graphene of a first doping type on a substrate; forming second graphene of a second doping type different from the first doping type on the first graphene, making the second graphene in contact with the first graphene, and exposing a portion of the first graphene; and forming a first electrode and a second electrode on the exposed first graphene and the second graphene, respectively.

Other detailed matters of the present invention are included in the detailed description and drawings.

Effects of the Invention

According to embodiments of the present invention, it is possible to fabricate a semiconductor device containing graphene p-n junctions using doped graphene. Also, it is possible to provide a fundamental base capable of applying graphene to optoelectronic devices such as a solar cell, a light emitting diode (LED), and a photodetector by assessing structural, optical, and electrical characteristics of a semiconductor device containing graphene p-n junctions for various doping concentrations.

DETAILED DESCRIPTION TO CARRY OUT THE INVENTION

Figure 1:
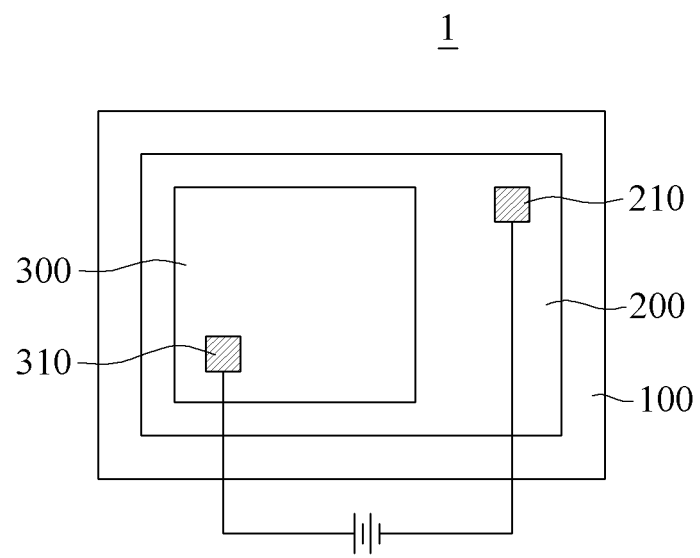
FIG. 1 is a top view of a semiconductor device according to an embodiment of the present invention.

Advantages and features of the invention and methods to achieve the same are described more fully hereinafter with reference to the accompanying drawings in which embodiments are shown. This invention may, however, be embodied in many different forms and should not be construed as limited to the embodiments set forth herein. Rather, these embodiments are provided so that this disclosure is thorough, and will fully convey the scope of the invention to those skilled in the art and this invention is defined by the scope of the claims. Like reference numerals refer to like elements throughout the present specification.

It will be understood that, although the terms "first", "second", etc. may be used herein to describe various elements, constituent elements and/or sections, the elements, constituent elements and/or sections should not be limited by these terms. These terms are only used to distinguish one element, constituent element, or section from another element, constituent element, or section. Thus, a first element, a first constituent element, or a first section discussed below should be termed a second element, a second constituent element, or a second section.

It will be understood that when an element or a layer is referred to as being "on" or "above" another element or layer, it can be directly on or above the other element or layer or intervening elements or layers may be present. In contrast, when an element is referred to as being "directly on" or "directly above", there are no intervening elements or layers.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented and the spatially relative descriptors used herein interpreted accordingly.

The terminology used herein is for the purpose of describing particular embodiments only and is not intended to be limiting of embodiments. As used herein, the singular forms "a", "an", and "the" are intended to include the plural forms as well, unless the context clearly indicates otherwise. It will be further understood that the terms "comprises" and/or "comprising", when used in this specification, specify the presence of stated features, steps, operations and/or components do not preclude the presence or addition of one or more features, steps, operations and/or components.

Unless otherwise defined, all terms (including technical and scientific terms) used herein have the same meaning as commonly understood by one of ordinary skill in the art to which the invention belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a semiconductor device according to an embodiment of the present invention will be described with reference to FIGS. 1 and 2.

FIG. 1 is a top view of a semiconductor device according to an embodiment of the present invention. FIG. 2 is a side view of the semiconductor device of FIG. 1.

Figure 2:
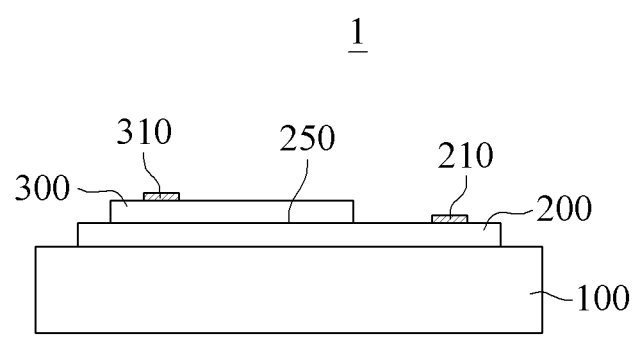
FIG. 2 is a side view of the semiconductor device of FIG. 1.

Referring to FIGS. 1 and 2, a semiconductor device 1 according to an embodiment of the present invention may include first graphene 200 of a first doping type and second graphene 300 of a second doping type. The first doping type and the second doping type are different conductivity types. In the semiconductor device according to an embodiment of the present invention, it is described that the first graphene 200 of the first doping type is n-type graphene and the second graphene 300 of the second doping type is p-type graphene, however, the present invention is not limited thereto. That is, the first graphene 200 of the first doping type may be p-type graphene and the second graphene 300 of the second doping type may be n-type graphene.

The embodiment of the present invention is described based on an example in which a doping type of the first graphene 200 is an n-type due to the following reasons. Pristine graphene can be p-type in air even without doping due to the reaction with oxygen molecules. Thus, if the second graphene 300 is provided in a n type, the n-type concentration of the second graphene 300 varies over time. Due to the above phenomenon, the n-type concentration of the second graphene 300 at the boundary with the p-type first graphene 200 may vary. When the concentration varies in a junction portion of p-n diodes, their reliable results cannot be obtained. Due to the aforementioned reasons, the embodiments of the present invention will be described based on an example in which the doping type of the first graphene 200 is provided in an n type.

The second graphene 300 may be disposed on the first graphene 200. The second graphene 300 may be disposed to be in contact with the first graphene 200. In detail, the first graphene 200 and the second graphene 300 may be disposed to be in direct contact with each other, and the first graphene 200 and the second graphene 300 may form, for example, p-n junction diodes, particularly, p-n vertical tunneling-junction diodes.

Each of the first graphene 200 and the second graphene 300 may be provided in a shape of, for example, a two-dimensional (2D) plane composed of a single layer, however, is not limited thereto.

Referring to FIG. 2, the first graphene 200 may include a high resistive layer or an insulating layer on a boundary surface 250 on which the first graphene 200 is in contact with the second graphene 300. The high resistive layer included in the first graphene 200 may be a layer that is not formed by inserting another material between the first graphene 200 and the second graphene 300, but is formed by adjusting the doping concentration of the first graphene 200. The high resistive layer included in the first graphene 200 is described later based on experimental results.

Referring to FIG. 1, the second graphene 300 and the first graphene 200 may substantially completely overlap with each other. However, overlapping of the first graphene 200 with the second graphene 300 is only provided to describe an embodiment of the present invention and the present invention is not limited thereto. That is, only a portion of the second graphene 300 may overlap with the first graphene 200 and form vertical tunneling-junctions and a remaining portion of the second graphene 300 may not form junctions.

Referring to FIGS. 1 and 2, the semiconductor device 1 may further include a substrate 100, a first electrode 210, and a second electrode 310. The first graphene 200 and the second graphene 300 may be disposed on the substrate 100. That is, the substrate 100, the first graphene 200, and the second graphene 300 may be sequentially disposed. The first electrode 210 may be formed on, for example, the first graphene 200. The second electrode 310 may be formed on, for example, the second graphene 300. According to an embodiment of the present invention, it is described in light of a top view that the first electrode 210 and the second electrode 310 are formed on the first graphene 200 and the second graphene 300, respectively.

However, the first electrode 210 and the second electrode 310 may be disposed by interposing the first graphene 200 and the second graphene 300 between the first electrode 210 and the second electrode 310. That is, the first electrode 210, the first graphene 200, the second graphene 300, and the second electrode 310 may be sequentially disposed and thereby form p-n vertical-junction diodes. Here, the first electrode 210 may be disposed between the first graphene 200 and the substrate 100.

In detail, the substrate 100 may be, for example, a rigid substrate, such as a silicon substrate, a silicon on insulator (SOI) substrate, a gallium arsenide substrate, a silicon germanium substrate, a ceramic substrate, a quartz substrate, or a glass substrate for display, and a flexible plastic substrate, such as polyimide, polyethylene terephthalate (PET), polyethylene naphthalate (PEN), poly methyl methacrylate (PMMA), polycarbonate (PC), poly ether sulfone (PES), and polyester. Also, the substrate 100 may be a transparent substrate capable of transmitting a light.

The first electrode 210 and the second electrode 310 may include a material forming an ohmic contact with graphene, and may include, for example, silver (Ag). Each of the first electrode 210 and the second electrode 310 may include a single layer, however, is not limited thereto. Each of the first electrode 210 and the second electrode 310 may further include an inserting layer (not shown) capable of reducing contact resistance with graphene.

A method of fabricating a semiconductor device according to an embodiment of the present invention will be described with reference to FIGS. 2 through 4.

Figure 3:
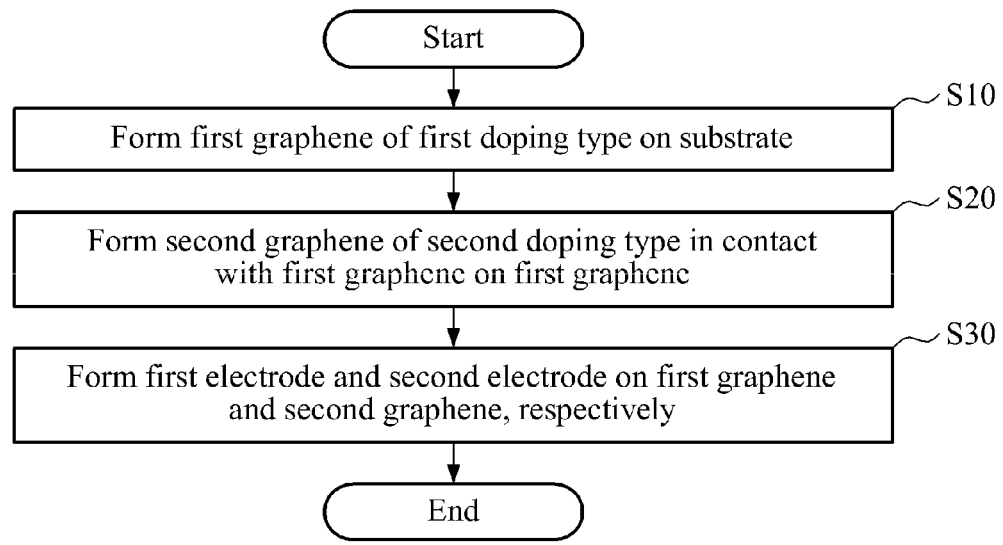
FIG. 3 is a flowchart illustrating a method of fabricating a semiconductor device according to an embodiment of the present invention.

FIG. 3 is a flowchart illustrating a method of fabricating a semiconductor device according to an embodiment of the present invention. FIG. 4 is a flowchart illustrating a method of doping impurities in graphene during a process of FIG. 3. FIGS. 3 and 4 are flowcharts to describe a method of fabricating a semiconductor device as illustrated in FIG. 2 and thus, a repeated description is omitted or a brief description is made.

Figure 4:
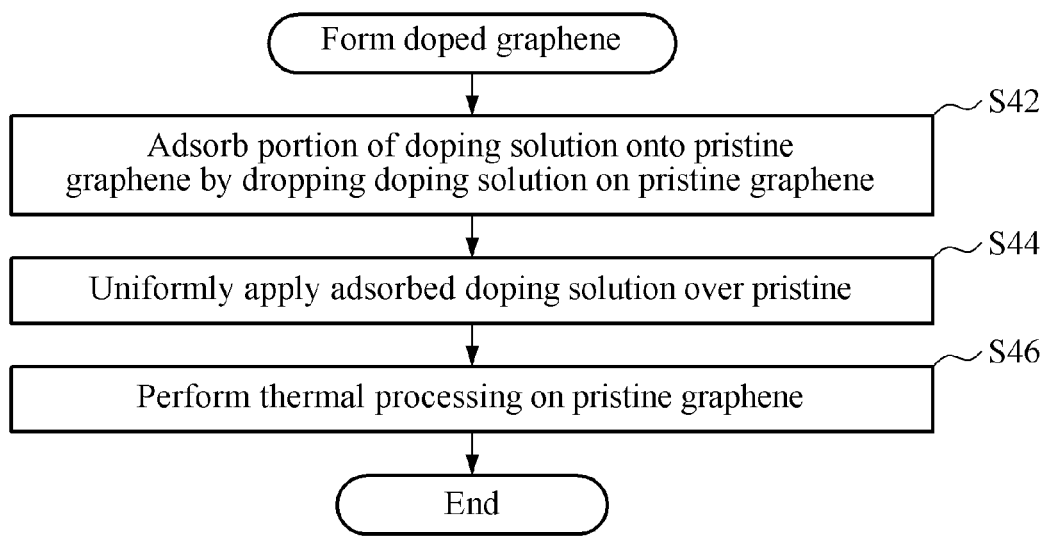
FIG. 4 is a flowchart illustrating a method of doping impurities in graphene during a process of FIG. 3.

Referring to FIGS. 2 through 4, the first graphene 200 of the first doping type may be formed on the substrate 100 in operation S10.

In detail, first pristine graphene is formed on the substrate 100 by fabricating the first pristine graphene and transferring it on the substrate 100. The first pristine graphene formed on the substrate 100 may be, for example, monolayer graphene.

A first dopant solution may be dropped on the first pristine graphene. In operation S42, the dropped first dopant solution may be adsorbed on the first pristine graphene. Since a doping type of the first graphene 200 is an n type, the first dopant solution may contain the first dopant. For example, the first dopant may be benzyl viologen (BV). The first pristine graphene may be maintained as doped with the first dopant solution for a predetermined duration of time. For a duration of time in which the first dopant solution is coated, a portion of the first dopant solution may be adsorbed on the first pristine graphene in operation S42. With increasing the duration of time in which the first dopant solution is coated, the amount of the first dopant solution adsorbed on the first pristine graphene may increase, which may lead to increasing the concentration of the first dopant adsorbed on the first pristine graphene.

In operation S44, the first dopant solution adsorbed on the first pristine graphene is uniformly coated over the first pristine graphene after a predetermined duration of time is elapsed. During uniformly coating the first dopant solution over the first pristine, the first dopant solution not adsorbed on the first pristine graphene may be removed. For example, a spin coater may be used to uniformly coat the first dopant solution over the first pristine graphene. When using the spin coater, it is possible not only to uniformly spread and coat the first dopant solution over the first pristine graphene but also to remove the not-adsorbed first doping solution. The spin coater may be spinned at, for example, 1000 revolutions per minute (rpm) to 3000 rpm. The spin coater may rotate the first pristine graphene doped with the first dopant solution for, for example, 30 seconds to 2 minutes.

In operation S46, thermal annealing is performed for the first pristine graphene doped with the first dopant solution. For example, a rapid thermal annealing (RTA) method may be employed for annealing the first pristine graphene. Annealing temperature may be, for example, 100 degrees to 300 degrees, and annealing time may be, for example, 10 minutes to 30 minutes. Through the thermal annealing, the first graphene 200 of the first doping type may be formed on the substrate 100.

Referring to FIGS. 2 through 4, the second graphene 300 of the second doping type different from the first doping type, in contact with the first graphene 200, may be formed on the first graphene 200 of the first doping type in operation S20. A portion of the first graphene 200 may be exposed by the second graphene 300.

Second pristine graphene is disposed on the first graphene 200 of the first doping type. The second pristine graphene may be, for example, monolayer graphene. In operation S42, a second dopant solution containing second dopant may be adsorbed on the second pristine graphene. Since the second graphene 300 is p type, the second dopant may be, for example, gold chloride ($AuCl_3$). The concentration of the second dopant adsorbed on the second pristine graphene may be adjusted by maintaining the second pristine graphene for a predetermined duration of time after dropping the dopant solution. In operation S44, the adsorbed second dopant solution may be uniformly coated over the second pristine graphene using, for example, a spin coater after a predetermined duration of time is elapsed. In operation S46, thermal annealing is performed for the second pristine graphene over which the second dopant solution is coated. Accordingly, the second graphene 300 of the second doping type is formed on the first graphene 200. The spin-coating and thermal-annealing methods are substantially identical to those used for forming the first graphene 200 and thus, a description related thereto is omitted.

Referring to FIGS. 2 and 3, the first electrode 210 and the second electrode 310 are formed on the exposed first graphene 200 and the second graphene 300, respectively, in operation S30.

Hereinafter, p-type graphene and n-type graphene used for a semiconductor device according to embodiments of the present invention and experimental results of the semiconductor device fabricated using the p-type graphene and the n-type graphene will be described with reference to FIGS. 5 through 14.

Figure 5:
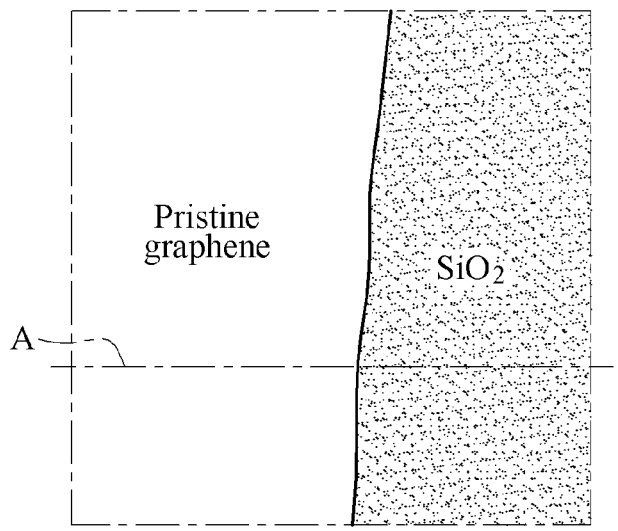
FIG. 5 illustrates a specimen for measuring a thickness of graphene used for a semiconductor device of the present invention.
Figure 6:
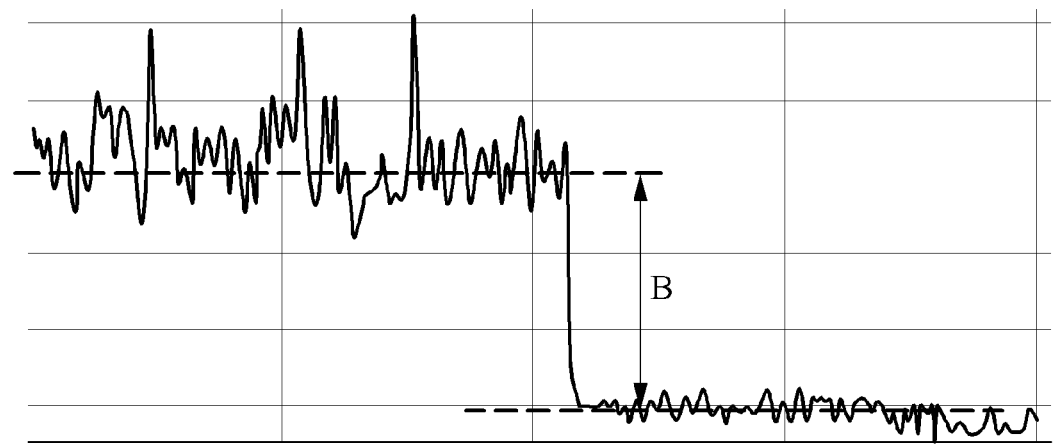
FIG. 6 is a height profile on the line A of FIG. 5.
Figure 7:
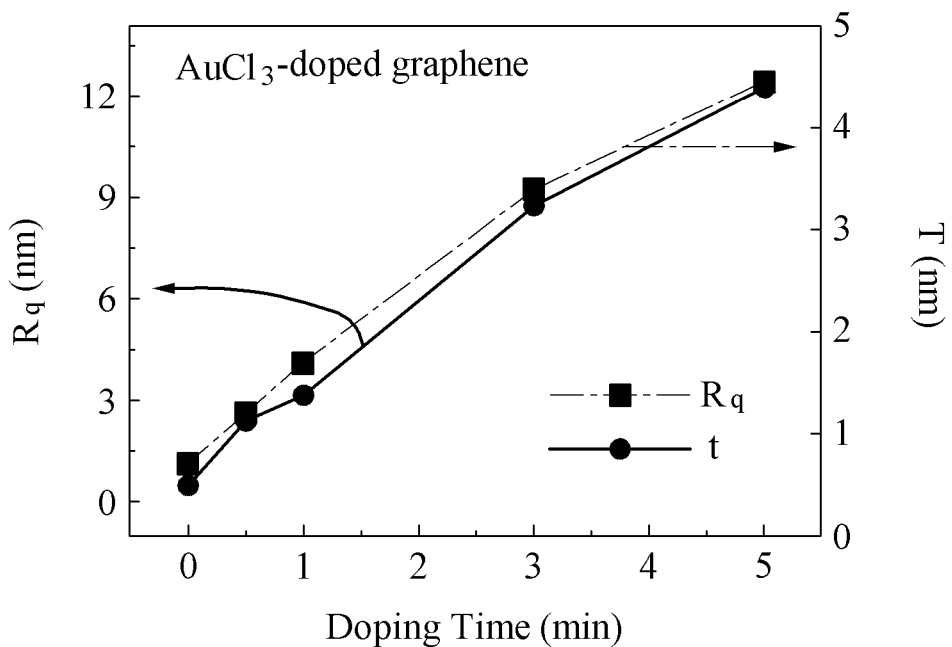
FIG. 7 is a graph showing doping time-dependent variations of roughness and thickness of p-type graphene used for a semiconductor device of the present invention.
Figure 8:
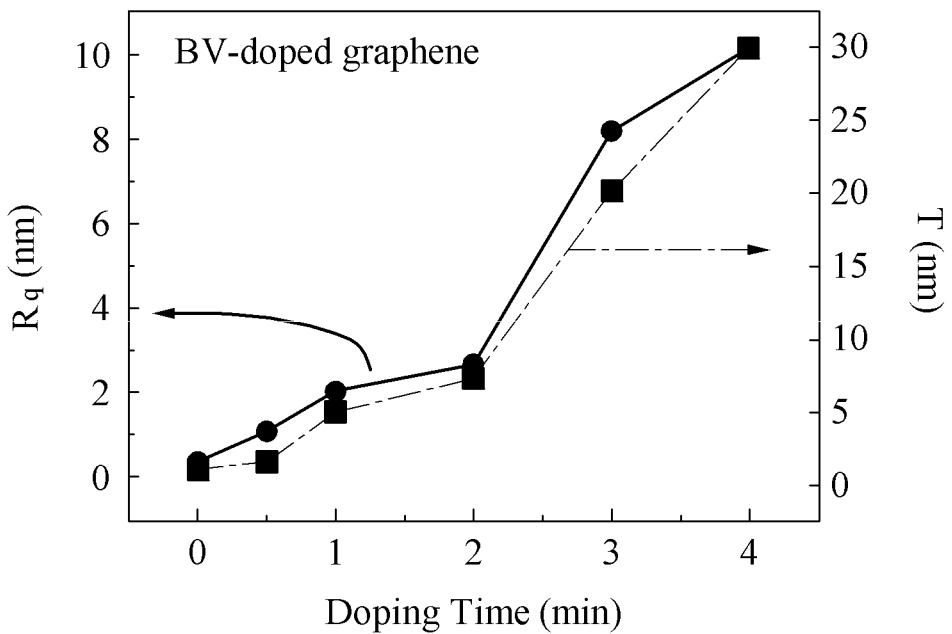
FIG. 8 is a graph showing doping time-dependent variations of roughness and thickness of n-type graphene used for a semiconductor device of the present invention.
Figure 9:
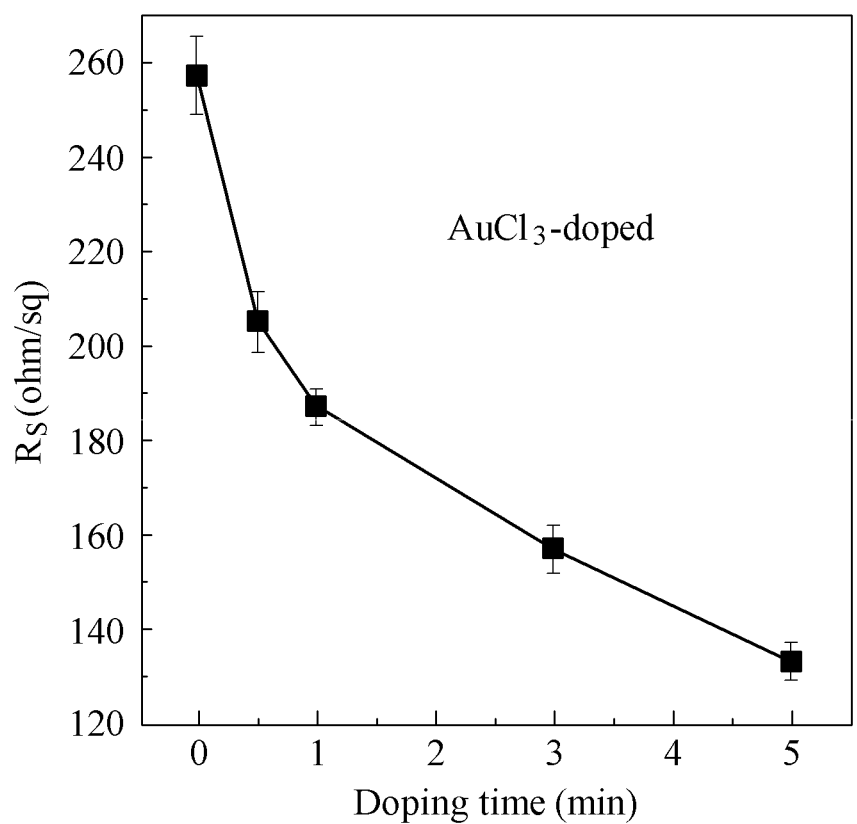
FIG. 9 is a graph showing doping time-dependent variation of sheet resistance of the p-type graphene of FIG. 7.
Figure 10:
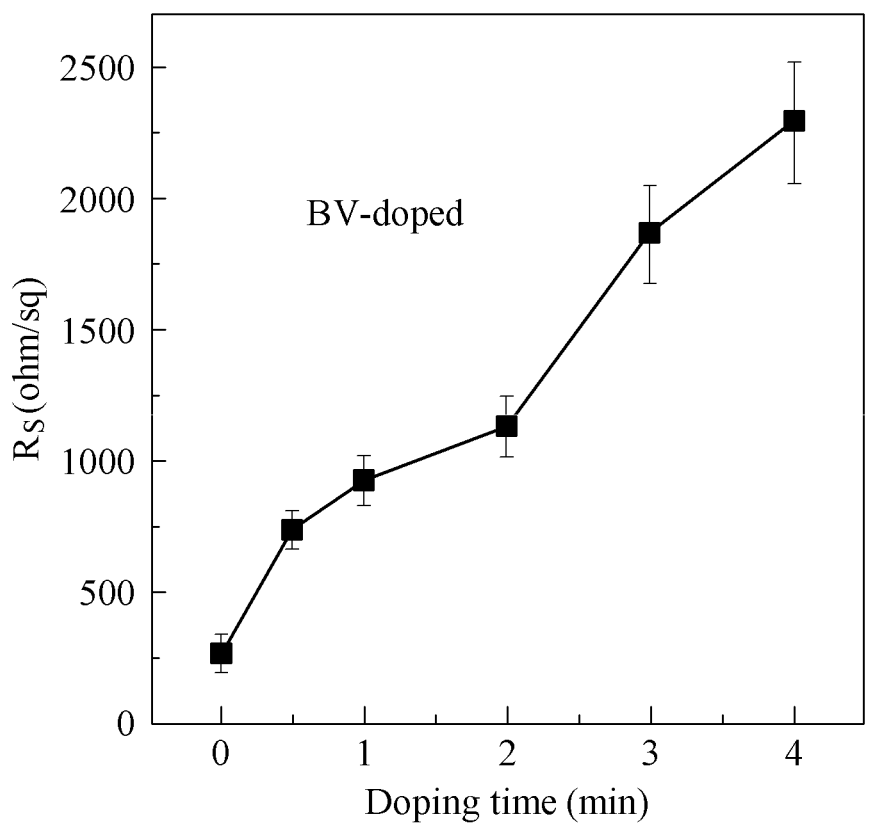
FIG. 10 is a graph showing doping time-dependent variation of sheet resistance of the n-type graphene of FIG. 8.
Figure 11:
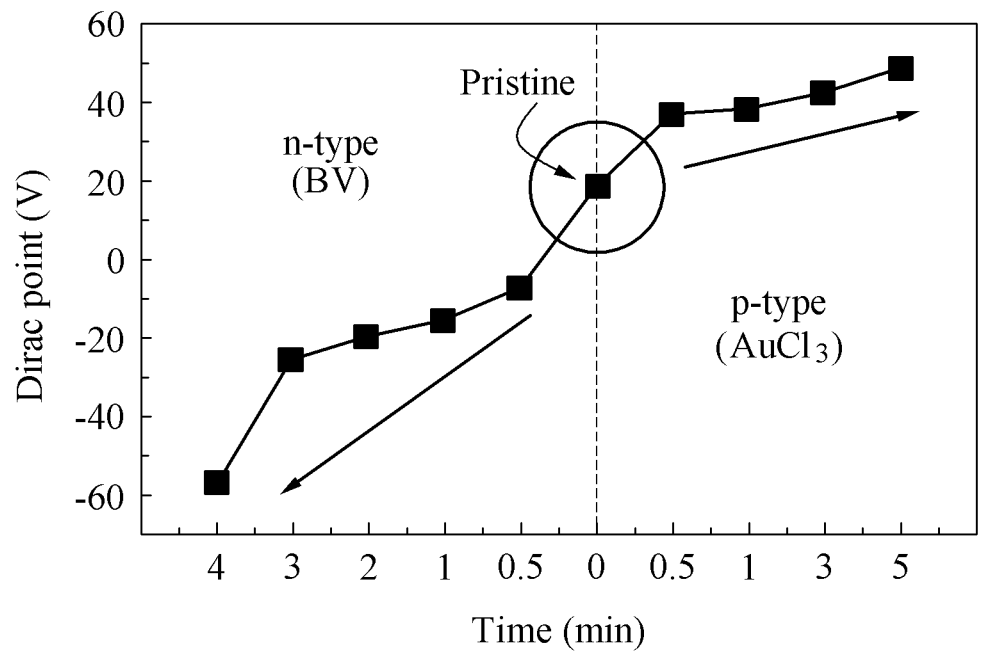
FIG. 11 is a graph showing doping time-dependent shifts of Dirac points of p-type graphene and n-type graphene used for a semiconductor device of the present invention.
Figure 12:
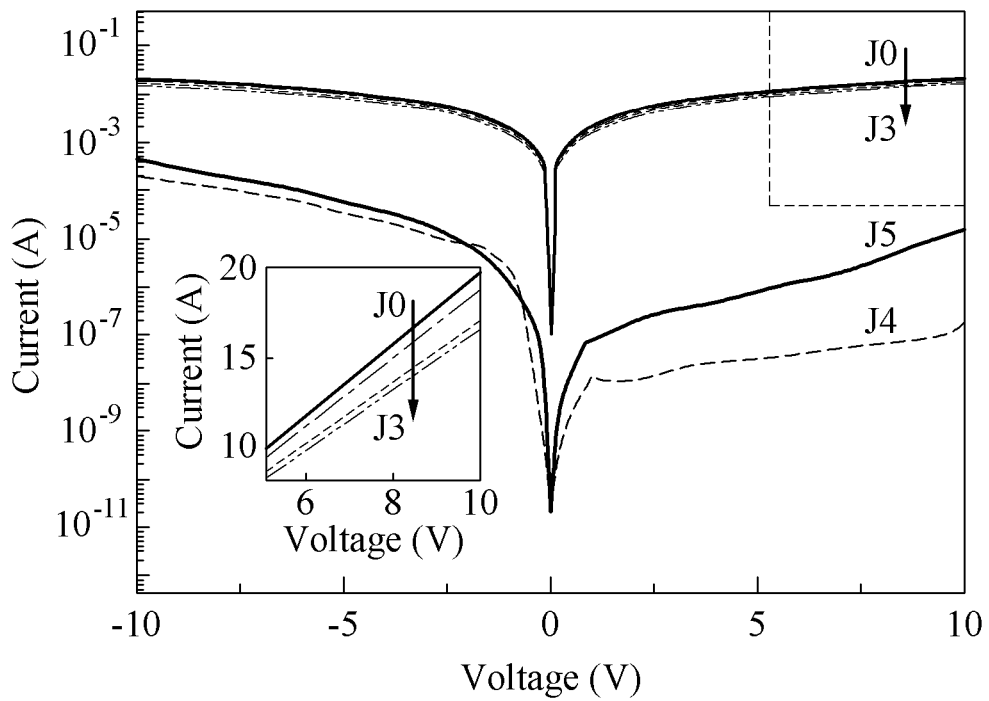
FIG. 12 is a log-scale graph showing I-V characteristics of a semiconductor device according to the present invention.
Figure 13:
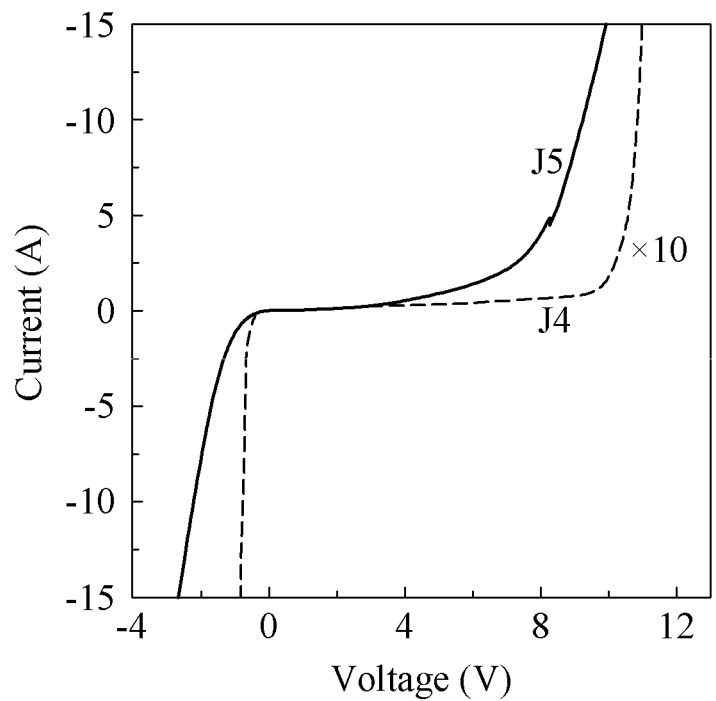
FIG. 13 is a linear-scale graph showing I-V characteristics of J4 and J15 in FIG. 12.
Figure 14:
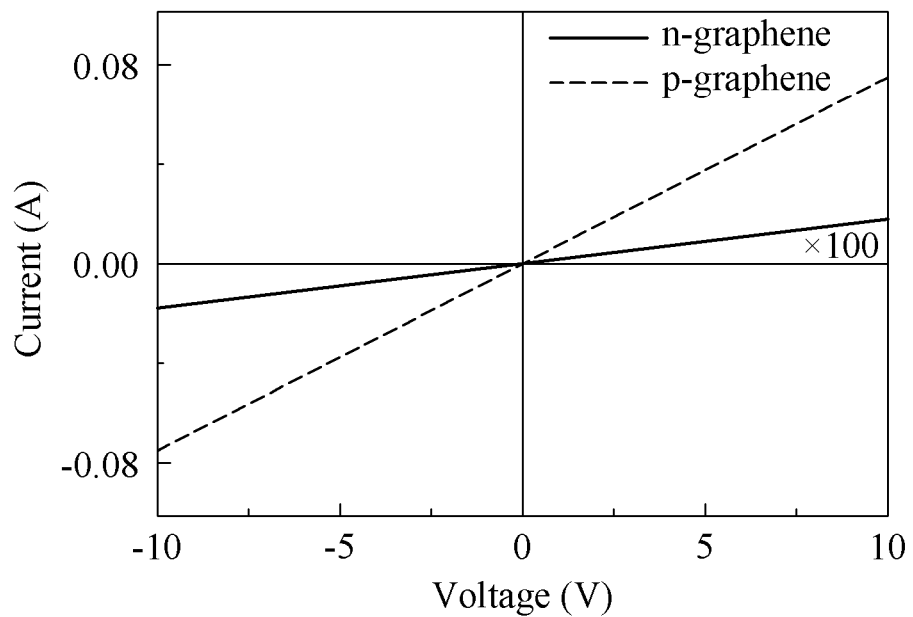
FIG. 14 is a graph showing junction characteristics between an electrode and conductive layers of the semiconductor device of FIG. 12.

FIG. 5 illustrates a specimen for measuring the thickness of graphene used for a semiconductor device of the present invention, and FIG. 6 is a height profile on the line A of FIG. 5. FIG. 7 is a graph showing doping-time-dependent variations of roughness and thickness of p-type graphene used for a semiconductor device of the present invention, and FIG. 8 is a graph showing doping-time-dependent variations of roughness and thickness of n-type graphene used for a semiconductor device of the present invention. FIG. 9 is a graph showing doping-time-dependent variation of sheet resistance of the p-type graphene of FIG. 7, and FIG. 10 is a graph showing doping-time-dependent variation of sheet resistance of the n-type graphene of FIG. 8. FIG. 11 is a graph showing doping-time-dependent shifts of Dirac points of p-type graphene and n-type graphene used for a semiconductor device of the present invention. FIG. 12 is a log-scale graph showing I-V characteristics of a semiconductor device according to the present invention, and FIG. 13 is a linear-scale graph showing the I-V characteristics of J4 and J15 in FIG. 12. FIG. 14 is a graph showing junction characteristics between an electrode and conductive layers of the semiconductor device of FIG. 12.

Referring to FIG. 5, a specimen shows pristine graphene that is disposed on a substrate. This specimen is for measuring the height of a step between the substrate and the pristine graphene using atomic force microscopy (AFM). For example, silicon wafer with a silicon oxide film formed on the surface was used for the substrate.

Referring to FIG. 6, B denotes a height difference between a pristine graphene sheet and the substrate. The height difference B from the substrate to the top surface of the pristine graphene sheet is about 0.7 nm. That is, the thickness of the pristine graphene is about 0.7 nm, similar to what is known so far for the thickness of a monolayer pristine graphene. Accordingly, this verifies that the pristine graphene used for the semiconductor device of the present invention is monolayer.

Gold chloride ($AuCl_3$) and benzyl viologen (BV) were used to form the p-type and n-type graphene layers, respectively, as described below. For example, the doing time and doping concentration may be adjusted to vary doping concentrations of the p-type graphene and the n-type graphene. However, in the semiconductor device of the present invention, the doping concentration was adjusted by varying the doping time. A predetermined duration of time is elapsed during doping after dropping the dopant solution on pristine graphene. Next, uniform doping is performed using a spin coater. In this instance, the doping time indicates a waiting time taken prior to spin coating. Also, thermal annealing was performed on the graphene at about 100 degrees for 10 minutes using an RTA method.

Referring to FIG. 7, the roughness $R_q$ and the thickness of the p-type graphene increase as the doping time increases. As the doping time increases, the amount of gold particles increases on the p-type graphene, resulting in the variations of the thickness and the roughness of the p-type graphene.

Referring to FIG. 8, the roughness $R_q$ and the thickness of the n-type graphene also increase as the doping time increases. This tendency is similar to the p-type graphene of FIG. 7. However, the n-type graphene shows sharp increases in both the thickness and the roughness as the doping time increases, compared to the p-type graphene. In detail, for the doping time being less than or equal to 2 minutes, the thickness and the roughness of the n-type graphene gradually increase. However, for the doping time exceeding 2 minutes, the thickness and the roughness of the n-type graphene sharply increase. Accordingly, this verifies that the surface of the n-type graphene is significantly varied above a doping time of 2 minutes for the dopant solution containing BV used for this experiment.

Referring to FIG. 9, the sheet resistance $R_s$ of the p-type graphene gradually decreases as the doping time increases. That is, due to the increase in the amount of gold particles on the p-type graphene, resulting from the increase of the doping time, the sheet resistance of the p-type graphene decreases from about 260 Ω/sq to about 130 Ω/sq.

Referring to FIG. 10, the sheet resistance of the n-type graphene gradually increases as the doping time increases, opposite to the result of FIG. 9. That is, despite the increase of the concentration of the BV to be adsorbed on the graphene, resulting from the increase of the doping time, the sheet resistance of the n-type graphene increases up to about 2300 Ω/sq with increasing the doping time up to 4 minutes. Accordingly, this verifies that the BV layer on graphene surface becomes semiconducting or insulating at high doping concentrations of BV, very dissimilar to gold particles of the p-type graphene. That is, as the doping time increases, the n-type graphene may include a high-resistive or insulating material layer on its surface.

Also, for the doping time exceeding 2 minutes, the sheet resistance of the n-type graphene sharply increases. This result is similar to the doping-time-dependent variations in the thickness and the roughness of the n-type graphene of FIG. 8.

Referring to FIG. 11, as the doping time increases, the Dirac point of the p-type graphene is shifted to the positive voltage whilst that of the n-type graphene is shifted to the contrary. Judging from the shift of the Dirac point, it can be determined whether the pristine graphene was doped to be p-type or n-type. The Dirac point of the pristine graphene is not located at zero volt but at a positive volt because the pristine graphene becomes p-type in air, possibly resulting from the adsorption of the air molecules.

Hereinafter, experimental results on the electrical characteristics of the semiconductor device of the present invention will be described. Experiment examples about the semiconductor device of the present invention are summarized in Table 1.

TABLE 1

|  | J0 | J1 | J2 | J3 | J4 | J5 |
|---|---|---|---|---|---|---|
| p-type graphene | pristine | 5 min | 5 min | 5 min | 5 min | 5 min |
| n-type graphene | pristine | 0.5 min | 1 min | 2 min | 3 min | 4 min |

P-n vertical junction diodes are fabricated using the p-type graphene and the n-type graphene. As described above, the p-type graphene is disposed on the n-type graphene. The doping-time dependence of the doping effect was weak in the p-type graphene, and thus the time of the gold chloride ($AuCl_3$) exposure was fixed at 5 minutes. In contrast, the doping-time dependence of the doping effect was stronger in the n-type graphene, and thus the time for benzyl viologen (BV) exposure was changed from 0.5 minutes to 4 minutes.

Referring to FIGS. 1, 12, and 13, a current flowing in the semiconductor device 1 in response to a forward voltage applied to the first graphene 200 that is the n-type graphene and the second graphene 300 that is the p-type graphene is referred to as a first current. A current flowing in the semiconductor device 1 in response to a reverse voltage applied to the first graphene 200 that is the n-type graphene and the second graphene 300 that is the p-type graphene is referred to as a second current. That is, being the forward voltage indicates that a potential of the second graphene 300 that is the p-type graphene is higher than a potential of the first graphene 200 that is the n-type graphene. Being the reverse voltage indicates an opposite case of the forward voltage.

In the case of experiment examples J0 through J3, the semiconductor device 1 shows no rectifying behaviors, judging from the linear current-voltage (I-V) curves of FIGS. 13 and 14. That is, in the experiment examples J0 through J3 in which the doping concentration of the n-type graphene is low, the vertical junctions of p-type graphene and n-type graphene are ohmic. When the doping concentration of the n-type graphene is low, the vertical junctions of p-type graphene and n-type graphene do not show rectifying behaviors due to the Klein-tunneling effect.

Referring to FIGS. 1, 12, and 13, experiment examples J4 and J5 show that the current is greatly reduced over the full range of bias voltage compared to the experiment examples J0 through J3. Also, I-V curves of the experiment examples J4 and J5 show nonlinear properties. That is, the experiment examples J4 and J5 in which the doping concentration of the n-type graphene is high show rectifying behaviors. From the experiment examples J4 and J5 in which the doping concentration of the n-type graphene is high, it can be known that the vertical junctions of p-type graphene and n-type graphene became diodes. That is, the experiment examples J4 and J5 are p-n vertical junction diodes using the graphene.

The J4 and J5 devices relate to experiment examples in which the times of the benzyl viologen (BV) exposure were 3 minutes and 4 minutes, respectively. Referring to FIGS. 8 and 10, in the experiment examples J4 and J5, the roughness and the thickness of the n-type graphene have sharply increased and the sheet resistance of the n-type graphene has relatively greatly increased. That is, when the sheet resistance of the n-type graphene increases by doping a large amount of benzyl viologen (BV) on the graphene, the vertical junctions of p-type graphene and n-type graphene become diodes showing rectifying behaviors.

Referring to FIGS. 1, 12, and 13, in the experiment examples J4 and J5, a first current that is a current flowing in the semiconductor device 1 in response to a forward voltage is smaller than a second current that is a current flowing in the semiconductor device 1 in response to a reverse voltage. Such diode properties look inverted in a conventional view of diodes. That is, in the case of a normal diode, a current flowing in response to a forward voltage applied to the diode is greater than a current flowing in response to a reverse voltage applied to the diode. However, in the case of the p-n vertical junction diodes formed using the p-type graphene and the n-type graphene, a current flowing in response to a forward voltage applied to the diode is smaller than a current flowing in response to a reverse voltage applied to the diode.

Referring to FIGS. 1, 12, and 13, in the case of the semiconductor device 1 including the p-n vertical junction diodes, a current under a reverse voltage is greater than a current under a forward voltage. In the p-n vertical junction diodes included in the semiconductor device 1, a p-type conductive layer and an n-type conductor layer are in direct contact with each other. The embodiment of the present invention is described that each of the p-type conductive layer and the n-type conductive layer includes graphene. However, the present invention is not limited thereto.

Referring to FIG. 14, each of p-type graphene and n-type graphene of the experiment example J5 is in ohmic contact with an electrode. Accordingly, since a voltage drop is absent in the electrode or a conducting wire connected to the electrode, the experimental results shown in FIGS. 13 and 14 are reliable.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A semiconductor device comprising:
   first graphene of a first doping type; and
   second graphene of a second doping type different from the first doping type, disposed on the first graphene and in contact with the first graphene,
   wherein the first graphene comprises a high resistive layer, and
   the high resistive layer is formed on a boundary surface between the first graphene and the second graphene.

2. The semiconductor device of claim 1, wherein the first doping type is an n type and the second doping type is a p type.

3. The semiconductor device of claim 2, wherein a current flowing in response to a forward voltage applied to the semiconductor device is a first current, and
   a current flowing in response to a reverse voltage applied to the semiconductor device is a second current, and
   the first current is smaller than the second current.

4. The semiconductor device of claim 1, wherein each of the first graphene and the second graphene comprises a single layer.

5. The semiconductor device of claim 1, further comprising:
   a substrate provided below the first graphene; and
   a first electrode and a second electrode formed on the first graphene and the second graphene, respectively.

6. A semiconductor device comprising a p-n diode, wherein a current flowing in response to a forward voltage applied to the p-n diode is a first current,
   a current flowing in response to a reverse voltage applied to the p-n diode is a second current, and
   the second current is greater than the first current,
   wherein the p-n diode is formed through a junction between first graphene of a first doping type and second graphene of a second doping type different from the first doping type, the second graphene being disposed on the first graphene and in contact with the first graphene,
   wherein the first graphene comprises a high resistive layer, and
   the high resistive layer is formed on a boundary surface between the first graphene and the second graphene.

7. The semiconductor device of claim 6, wherein the first doping type of the first graphene is a p type and the second doping type of the second graphene is an n type.

8. The semiconductor device of claim 7, wherein the first graphene and the second graphene are vertically joined.

9. A method of fabricating a semiconductor device, the method comprising:

forming first graphene of a first doping type on a substrate;

forming second graphene of a second doping type different from the first doping type on the first graphene, making the second graphene in contact with the first graphene, and exposing a portion of the first graphene; and forming a first electrode and a second electrode on the exposed first graphene and the second graphene, respectively, wherein the forming of the first graphene of the first doping type comprises:

forming first pristine graphene on the substrate;

dropping a first dopant solution on the first pristine graphene, for the dopant solution to be adsorbed on a portion of the first pristine grapheme;

uniformly coating the adsorbed first dopant solution over the first pristine graphene; and performing thermal annealing of the first pristine graphene over which the first dopant solution is coated.

10. The method of claim 9, wherein the first doping type is an n type, and the second doping type is a p type.

11. The method of claim 9, wherein a spin coater method is employed to uniformly coat the adsorbed first dopant solution over the first pristine graphene, and the thermal annealing employs a rapid thermal annealing (RTA) method.

12. The method of claim 11, wherein the thermal annealing is performed at a temperature between 100 degrees and 300 degrees for 10 minutes to 30 minutes.

* * * * *